(12) United States Patent
Hellberg

(10) Patent No.: US 7,071,774 B2
(45) Date of Patent: Jul. 4, 2006

(54) COMPOSITE AMPLIFIER

(75) Inventor: Richard Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/497,186

(22) PCT Filed: Oct. 29, 2002

(86) PCT No.: PCT/SE02/01959

§ 371 (c)(1),
(2), (4) Date: May 28, 2004

(87) PCT Pub. No.: WO03/047093

PCT Pub. Date: Jun. 5, 2003

(65) Prior Publication Data

US 2004/0263242 A1    Dec. 30, 2004

(30) Foreign Application Priority Data

Nov. 29, 2001    (SE) .................................... 0104011

(51) Int. Cl.
*H03F 3/68* (2006.01)
(52) U.S. Cl. ................. 330/124 R; 330/295
(58) Field of Classification Search ............ 330/124 R, 330/295, 2, 302
See application file for complete search history.

(56) References Cited

U.S. PATENT DOCUMENTS 5,901,346 A    5/1999  Stengel et al.
6,054,896 A    4/2000  Wright et al.
6,201,452 B1 *  3/2001  Dent et al. ................. 332/103
6,737,914 B1 *  5/2004  Gu ................................ 330/2
6,825,719 B1 * 11/2004  Barak et al. ................ 330/129

OTHER PUBLICATIONS

H. Chireix, Proceedings of the Institute of Radio Engineers, High Power Outphasing Modulation, vol. 23, No. 11, Nov. 1935, pp. 1370-1392.

(Continued)

*Primary Examiner*—Henry Choe
(74) *Attorney, Agent, or Firm*—Nixon & Vanderhye P.C.

(57) ABSTRACT

A composite amplifier includes a first and a second power amplifier connected to a Chireix output network. A signal component separator and an IQ separator provide equal first and linear drive signal components that depends linearly on the amplitude $A(t)$ of an amplitude modulated input signal. The signal component separator and IQ separator provide first and second nonlinear drive signal components that have the same magnitude but opposite signs and depend non-linearly as $\sqrt{1-A(t)}$ on the amplitude $A(t)$ and are in quadrature to the first and second linear drive signal components. Amplitude-phase adjusters individually adjust amplitudes and phases of the drive signal components to lower drive power consumption. Summers form a first composite drive signal to the first power amplifier by adding the adjusted first linear drive signal component to the adjusted first non-linear drive signal component a second composite drive signal to the second power amplifier by adding the adjusted second linear drive signal component to the adjusted second non-linear drive signal component.

27 Claims, 9 Drawing Sheets

OTHER PUBLICATIONS

Ampliphase AM Transmission System, ABU Technical Review, No. 33, Jul. 1974, pp. 10-18.
I. Ullah, Output Circuit of an Ampliphase Broadcast Transmitter, ABU Technical Review, No. 63, pp. 17-24, Jul. 1979.
F. Raab, Efficiency of Outphasing RF Power-Amplifier Systems, IEEE Transactions Communications, vol. COM-33, No. 10, pp. 1094-1099, Oct. 1995.
B. Stengel, IEEE Transactions On Vehicular Technology, vol. 49, No. 1, Jan. 2000, Linc Power Amplifier Combiner Method Efficiency Optimization, pp. 229-234.
Q. Zhang, Gain and Phase Error-Free LINC Transmitter, IEEE Transactions On Vehicular Technology, vol. 49, No. 5, Sep. 2000, pp. 1986-1994.

* cited by examiner

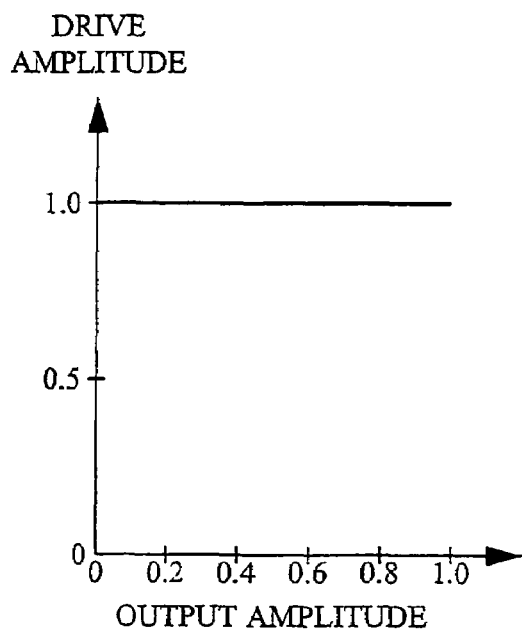
Fig. 3
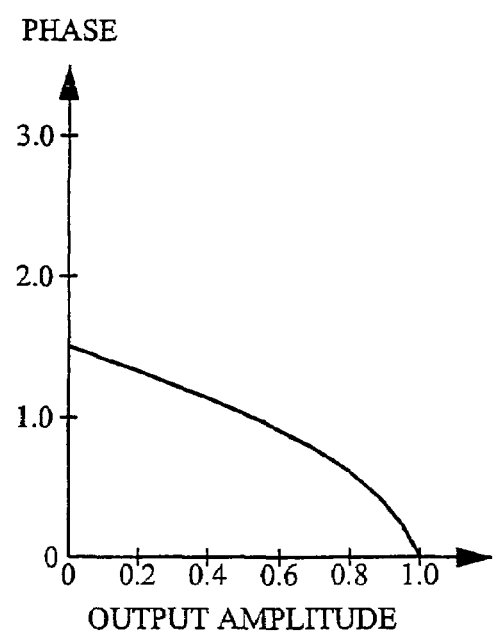
(PRIOR ART) Fig. 4
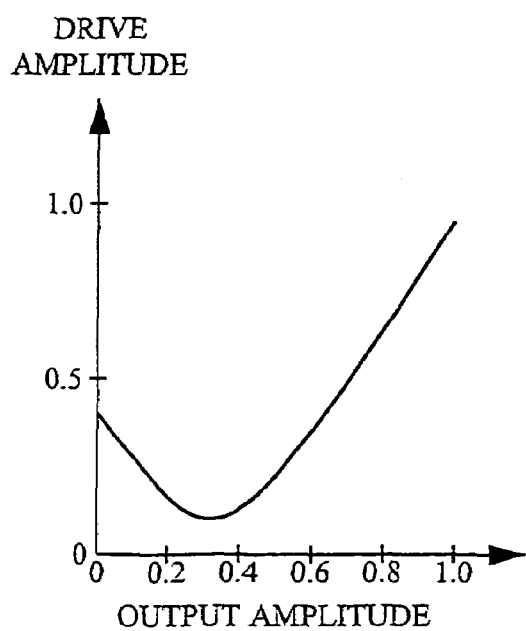
Fig. 5
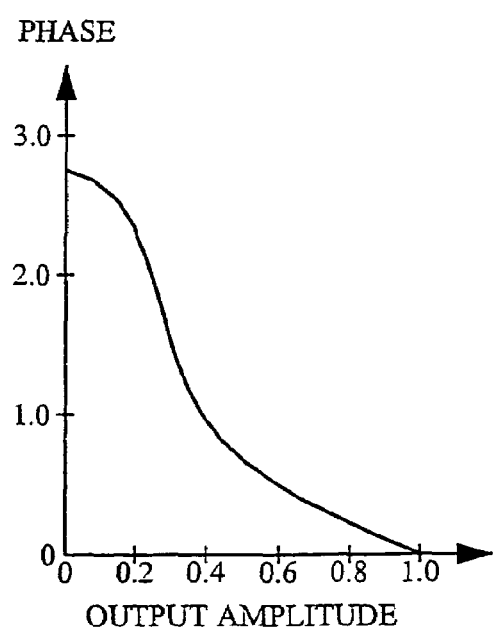
Fig. 6

COMPOSITE AMPLIFIER

This application is the US national phase of international application PCT/SE02/01959 filed 29 Oct. 2002 which designated the U.S. and claims benefit of SE 0104011-2, dated 29 Nov. 2001, the entire content of which is hereby incorporated by reference.

TECHNICAL FIELD

The present invention relates to a composite amplifier including two power amplifiers that are connected to a load over a Chireix output network.

BACKGROUND

In many wireless communications systems the power amplifiers in the transmitter are required to be very linear, in addition to being able to simultaneously amplify many radio channels (frequencies) spread across a fairly wide bandwidth. They also have to do this efficiently, in order to reduce power consumption and need for cooling, and to increase the lifetime of the amplifiers. The linearity is required to be good since nonlinear amplifiers would cause leakage of interfering signal energy between channels.

The amplitude probability density of a mix of sufficiently many independent radio frequency (RF) channels, or of a multi-user CDMA signal (CDMA=Code Division Multiple Access), tends to be close to a Rayleigh distribution having a large peak-to-average power ratio. Since a conventional RF power amplifier (especially class B) generally has an efficiency proportional to its output amplitude, its average efficiency is very low for such signals.

In response to the low efficiency of conventional linear power amplifiers, several methods have been proposed. One of these is the Chireix outphasing method, sometimes and in some embodiments called "linear amplification using nonlinear components" (LINC). The Chireix method has been used extensively for AM broadcast transmitters. However, the method has so far been unsuccessful in delivering the theoretical high efficiency for high peak-to-average power ratios, especially while maintaining high linearity and when using practical RF transistors.

SUMMARY

An object of the present invention is to increase the efficiency of a composite amplifier having a Chireix output network. Preferably this amplifier should also be highly linear.

This object is achieved in accordance with the attached claims.

Briefly, the efficiency of the composite amplifier can be increased by forming a non-constant low power drive signal that depends non-linearly on the amplitude of the input signal to one or both of the power amplifiers.

A preferred embodiment separates the outphased signals into in-phase and quadrature-phase components, which are individually amplitude and phase adjusted and recombined to reduce drive power consumption.

By proper filtering, the amplifier will be highly linear over a wide frequency range. In addition to improved efficiency, this solution also reduces the precision requirements for the combining Chireix network, RF chains and signal component separation, thereby greatly simplifying production.

BRIEF DESCRIPTION OF THE DRAWINGS

The invention, together with further objects and advantages thereof, may best be understood by making reference to the following description taken together with the accompanying drawings, in which:

FIG. 3 is a diagram illustrating the relationship between drive signal amplitude and output signal amplitude of one power amplifier in a conventional Chireix amplifier;

FIG. 4 is a diagram illustrating the relationship between drive signal phase and output signal amplitude of one power amplifier in a conventional Chireix amplifier;

FIG. 5 is a diagram illustrating the relationship between drive signal amplitude and output signal amplitude of one power amplifier in a composite amplifier in accordance with the present invention;

FIG. 6 is a diagram illustrating the relationship between drive signal phase and output signal amplitude of one power amplifier in a composite amplifier in accordance with the present invention;

DETAILED DESCRIPTION

In the following description the same reference designations will be used for the same or similar elements throughout the figures of the drawings.

Furthermore, although they are slightly different, the output networks of both Chireix and LINC amplifiers will be denoted Chireix type output networks.

Figure 1:
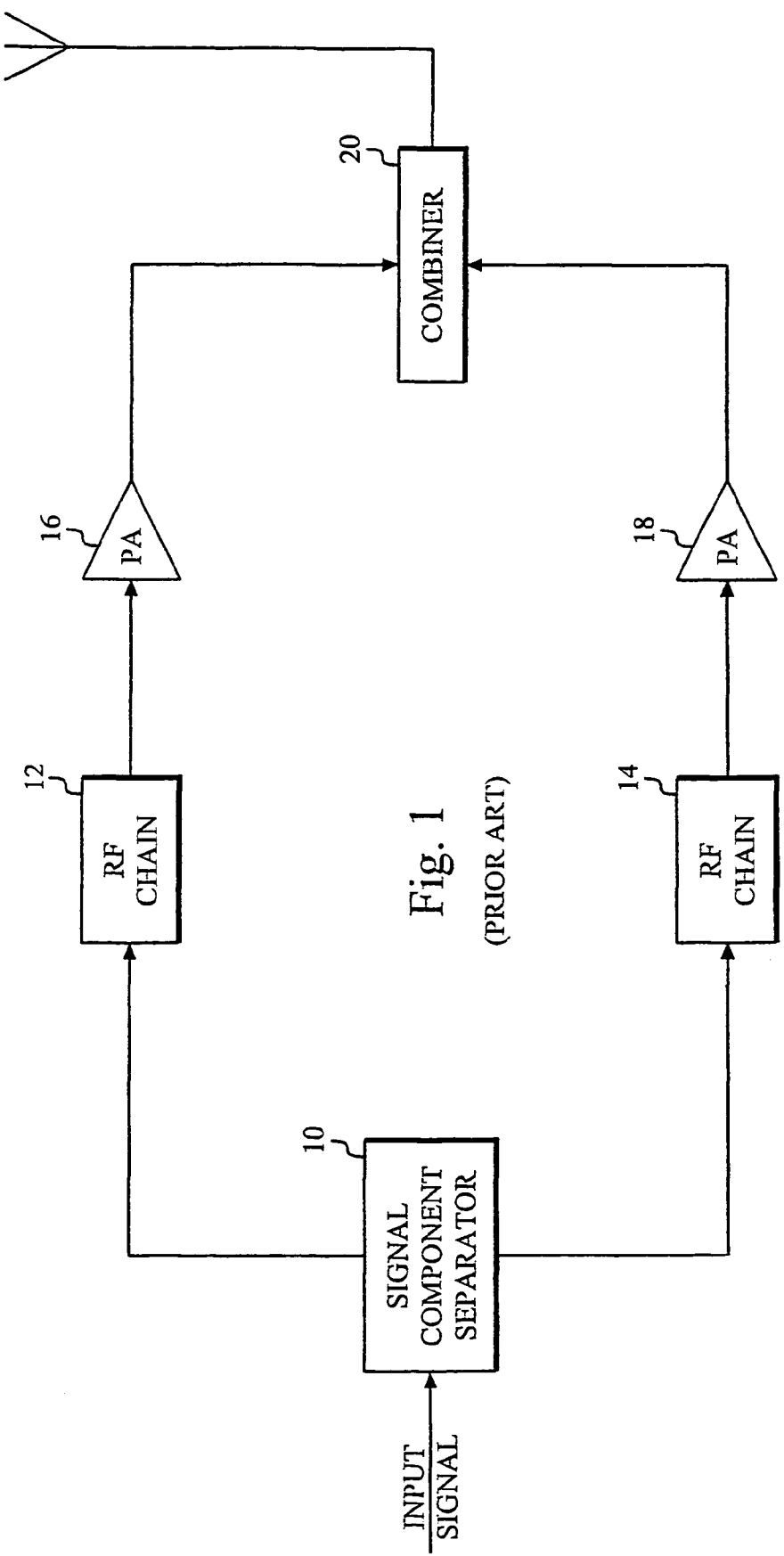
FIG. 1 is a block diagram of a conventional Chireix amplifier.

FIG. 1 is a block diagram of a conventional Chireix amplifier. The term "outphasing", which is the key method in Chireix and LINC amplifiers, generally means the method of obtaining amplitude modulation by combining two phase-modulated constant-amplitude signals produced in a signal component separator 10. After up-conversion and amplification through RF chains 12, 14 (mixers, filters, amplifiers) and power amplifiers 16, 18, the outphased signals are combined to form an amplified linear signal in a Chireix output combiner network 20. The phases of these constant-amplitude outphased signals are chosen so that the result from their vector-summation yields the desired amplitude. All amplitudes from zero to full amplitude, as well as negative amplitudes, can be obtained in this way.

The theoretical efficiency of outphasing amplifiers with Chireix-type output networks has been previously derived under the assumption in F. H. Raab, "Efficiency of Outphasing RF Power Amplifier Systems", IEEE Trans. Communications, vol. COM-33, no. 10, pp. 1094–1099, October 1985 that the two constituent amplifiers (i.e. transistors or parallel combinations of transistors) are working as class-B or class-C amplifiers in saturation. This makes them act as constant RF voltage sources, and the peak efficiency is assumed to be the same as for class-B amplifiers. In B. Stengel and W. R. Eisenstadt, "LINC Power Amplifier Combiner Method Efficiency Optimization", IEEE Trans. Vehicular Technology, vol. 49, no. 1, pp. 229–234, January 2000, the assumed peak efficiency is 100%. In addition to deriving efficiency calculations for constant-voltage-source Chireix amplifiers, the Stengel et al. article also states that a similar theoretical analysis can be performed assuming constant-current RF sources.

The problems associated with conventional Chireix or LINC amplifiers affect both linearity and efficiency. The non-linearity is caused mainly by imbalances between the RF chains, power amplifiers and in the output combiner. The efficiency problem is caused by the high RF drive powers needed to saturate the constituent amplifiers.

The drive power of conventional LINC or Chireix amplifier is constant for all output amplitude levels, and higher than the maximum required drive power for a class-B amplifier. This is because the constituent amplifiers are required to operate as phase-modulated constant-voltage sources, a condition which is generally obtained by saturating (overdriving) the amplifiers. The drive signals are constant-envelope signals, which require a high and constant drive power.

The problem of having a constant high drive power is especially severe when the transmitter is operating with a high peak-to-average power ratio, or with the average output power backed down. For example, if the peak-to-average ratio is 10 dB, and the gain of the output transistors at max output is 10 dB, the (average) drive power equals the average output power. These quite normal figures illustrate the severity of this problem. Even if everything else (including the generation of the constant-amplitude drive signals) is 100% efficient, the total efficiency would only be 50%. The drive power is thus a major contributor to inefficiency in practical Chireix amplifiers.

The LINC and Chireix amplifiers are theoretically very linear. In practice, however, the linearity is deteriorated due to imbalances between the RF chains (amplifiers, mixers and filters) from the generation of the constant-envelope signals to the output transistors, and also due to non-ideal and unbalanced output networks. The behavior of the output network is hard to control with the required precision, especially without trimming. This means that it is difficult to produce such amplifiers with sufficient yield. Ironically, the feature that many consider the key to linearity in LINC amplifiers, namely saturated constant voltage operation, is a limiting factor for achieving high linearity in practice. This is because the required amplitude gain compression makes it hard to correct for amplitude imbalances.

The high power of the drive signals can also possibly cause non-linearity in any outphasing system by leaking to the output without combining in the right way. Leakage can also be a problem in systems using linearization equipment, where the nonlinear drive signals in this way can reach sensitive nodes used for measuring or canceling distortions.

By separating each constant-amplitude phase-modulated signal from a standard signal component separator 10 into a linear part and a nonlinear part, changing the amplitude and phase of these components individually according to a set of specific rules, and recombining the parts into a signal with new properties, the present invention provides a drive signal to a new Chireix-type amplifier. This amplifier will have substantially lower drive power consumption than the standard Chireix amplifier, and can be made linear over a wide bandwidth, as will be illustrated below.

Figure 2:
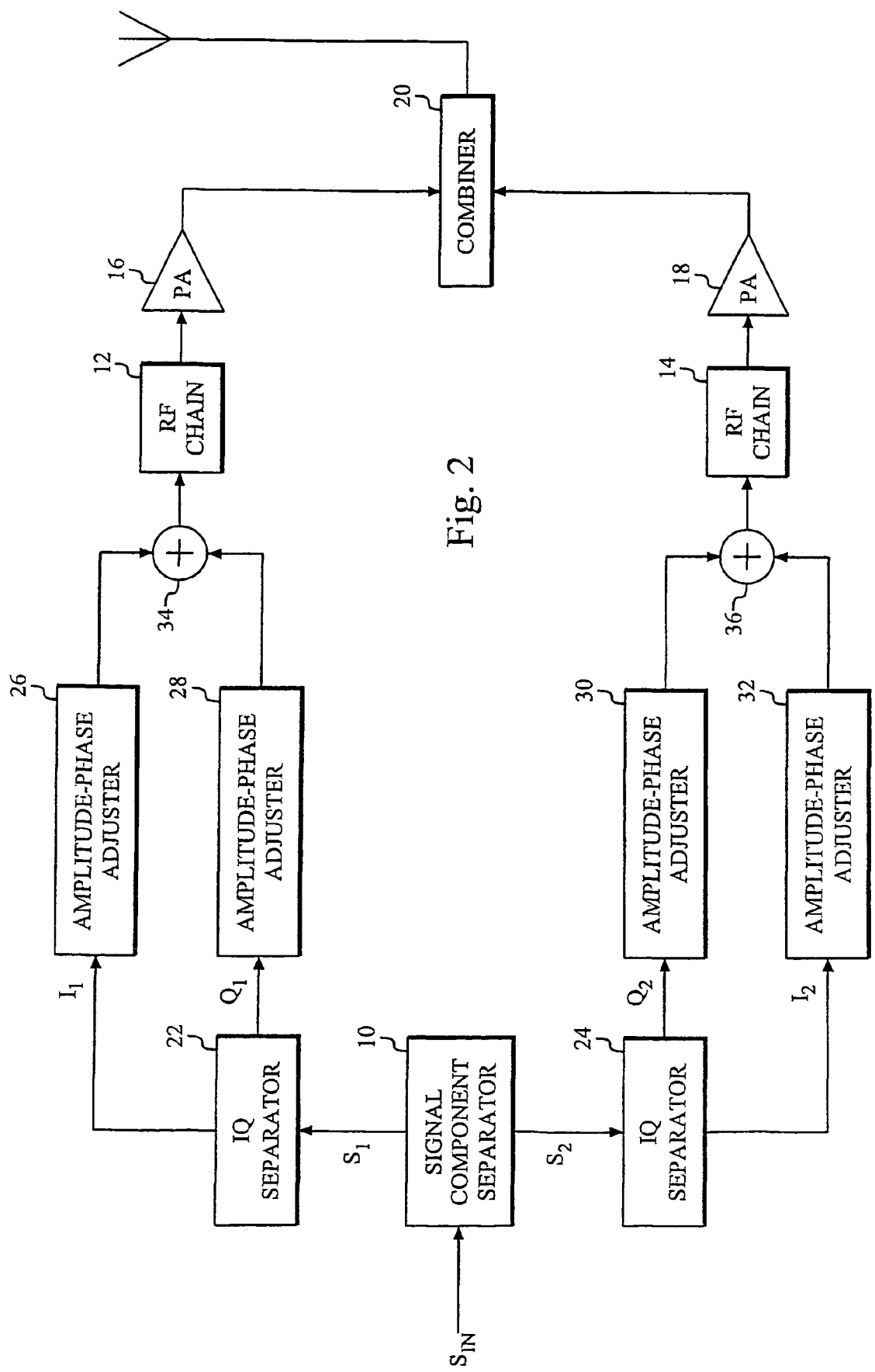
FIG. 2 is a block diagram illustrating the principles of a composite amplifier in accordance with the present invention.

FIG. 2 is a block diagram illustrating the principles of a composite amplifier in accordance with the present invention. The input signal to the composite amplifier (in order to simplify the expressions the phase-modulation is ignored, since it only adds a common phase) may be expressed as $$s_{IN}(t) = A(t)\cos \omega t$$

In accordance with Chireix practice, signal component separator 10 separates this signal into the two constant-amplitude phase-modulated signals $$\begin{cases} s_1(t) = \cos(\omega t + \cos^{-1} A(t)) \\ s_2(t) = \cos(\omega t - \cos^{-1} A(t)) \end{cases}$$

Using the trigonometric identities $$\begin{cases} \cos(\alpha + \beta) = \cos\alpha\cos\beta - \sin\alpha\sin\beta \\ \cos(\alpha - \beta) = \cos\alpha\cos\beta + \sin\alpha\sin\beta \end{cases}$$

these signals may be expressed as $$\begin{cases} s_1(t) = A(t)\cos \omega t - \sin(\cos^{-1} A(t))\sin \omega t \\ s_2(t) = A(t)\cos \omega t + \sin(\cos^{-1} A(t))\sin \omega t \end{cases}$$

Using the identity $$\cos^{-1}\alpha = \sin^{-1}\sqrt{1-\alpha^2}$$

one obtains $$\begin{cases} s_1(t) = A(t)\cos \omega t - \sqrt{1 - A(t)^2} \sin \omega t = \text{Re}\left\{\left(\frac{A(t)}{I_1} + j\frac{\sqrt{1 - A(t)^2}}{Q_1}\right) \cdot e^{j\omega t}\right\} \\ s_2(t) = A(t)\cos \omega t + \sqrt{1 - A(t)^2} \sin \omega t = \text{Re}\left\{\left(\frac{A(t)}{I_2} + j\frac{\sqrt{1 - A(t)^2}}{Q_2}\right) \cdot e^{j\omega t}\right\} \end{cases}$$

From these expressions the in-phase (I) and quadrature-phase (Q) components may be identified as $$\begin{cases} I_{1,2} = A(t) \\ Q_{1,2} = \pm\sqrt{1 - A(t)^2} \end{cases}$$

These signals are generated by IQ generators 22, 24. It is noted that both signals have equal in-phase components and equal magnitude quadrature-phase components with opposite signs. Furthermore, it is noted that the in-phase components are linear in A(t), whereas the quadrature-phase components are non-linear in A(t).

In accordance with the present invention the I and Q components are individually adjusted with respect to amplitude and phase in amplitude-phase adjusters 26, 28, 30, 32. Several adjustment methods, which include both constant and frequency dependent adjustments, will be discussed below. The adjusted I and Q components are added in adders 34 and 36, respectively, and then forwarded to RF chains 12, 14. In an analog embodiment adders 34, 26 may, for example, be realized as hybrids. In a digital embodiment the are digital adders. As indicated by an antenna, the composite amplifier may be part of a transmitter, for example a transmitter in a base station in a cellular mobile radio communication system.

A first method of adjusting the phases and amplitudes of the I and Q drive signal components is based on emulating the behavior of the output network (which is assumed perfectly balanced) when a constant-voltage condition is imposed on the output transistors. The same voltage amplitude, usually the maximum allowed RF voltage, is used for both transistors.

The complex adjustment factors for the linear I parts are obtained by calculating (for example by using a model of the amplifier) the current in each transistor output node when the transistor output node voltages are equal. This is due to the fact that the linear parts of the voltage at the transistors should be in-phase with each other.

The complex adjustment factors for the non-linear Q parts are obtained by calculating (using the model) the current in each transistor output node when the transistor node voltages are of equal magnitude but of opposite sign. This is due to the fact that the nonlinear parts of the voltage at the transistors should be in anti-phase with each other (and, as stated before: in quadrature with the linear parts).

To obtain the desired drive signal at a certain point in the chain, these adjustment factors (which are in the form of output current) are divided by the gain and compensated for the phase (and corresponding dimension changes) of the RF chain back to adjustment elements 26, 28, 30, 32.

FIGS. 3–6 illustrate the relationship between one of the drive signals and the output signal amplitude for a conventional Chireix amplifier (FIGS. 3–4) and for composite amplifier in accordance with the present invention (FIGS. 5–6). As can be seen from these figures, the magnitude is non-constant and smaller for the present invention. The phase dependence is also different, with a greater total range and a different variation pattern.

Figure 7:
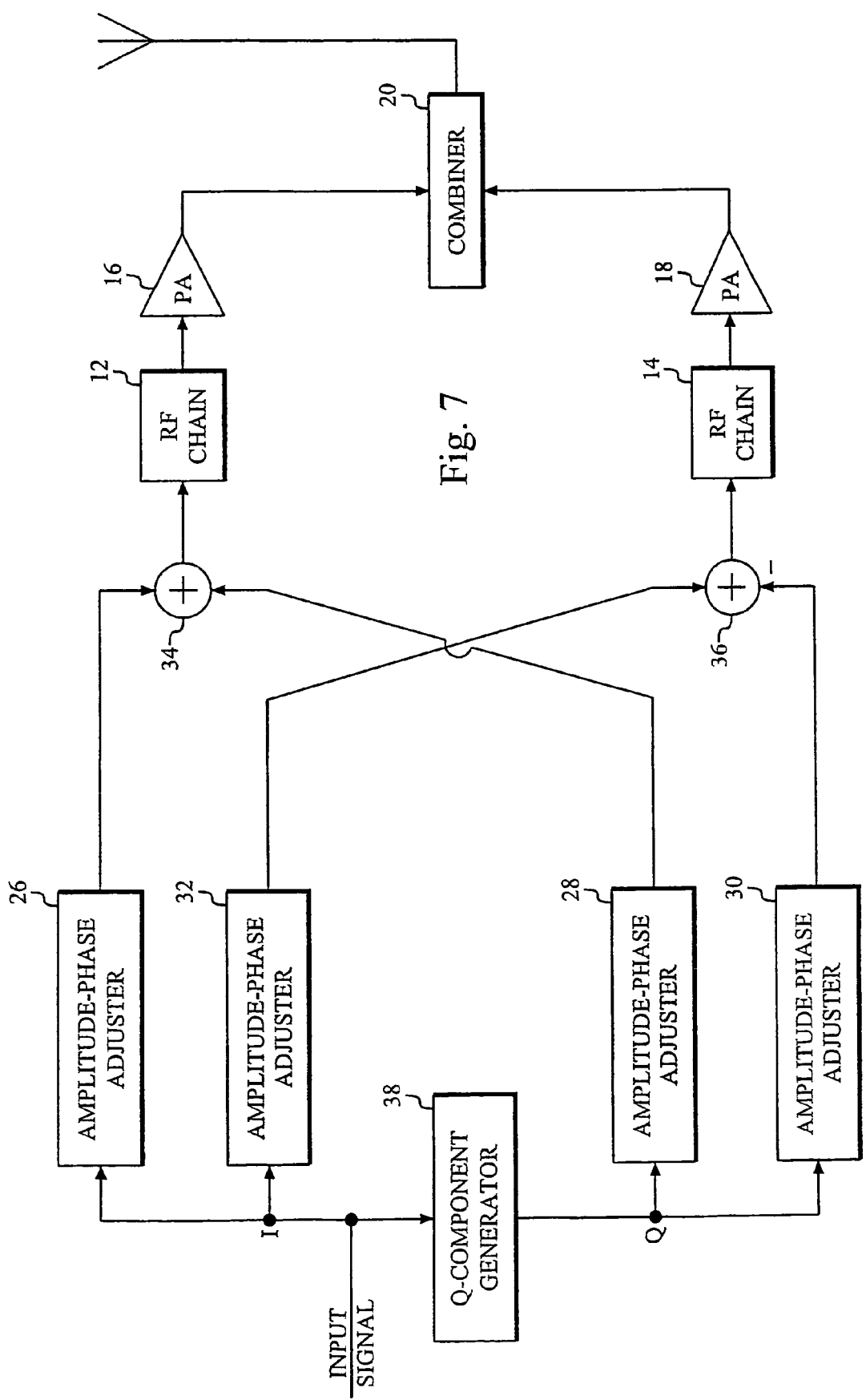
FIG. 7 is a block diagram of an embodiment of the composite amplifier in accordance with the present invention.

FIG. 7 is a block diagram of an embodiment of the composite amplifier in accordance with the present invention. The embodiment in FIG. 2 is a modification of a conventional Chireix amplifier. However, inspection of the expression for the in-phase component above, reveals that it is actually the same as the input signal. Thus, signal component separator 10 from the Chireix amplifier is actually not required to produce this signal. Instead the embodiment in FIG. 7 requires only a quadrature-phase component generator 38, and this generator may be used to generate both Q components, since they only differ in sign.

Figure 8:
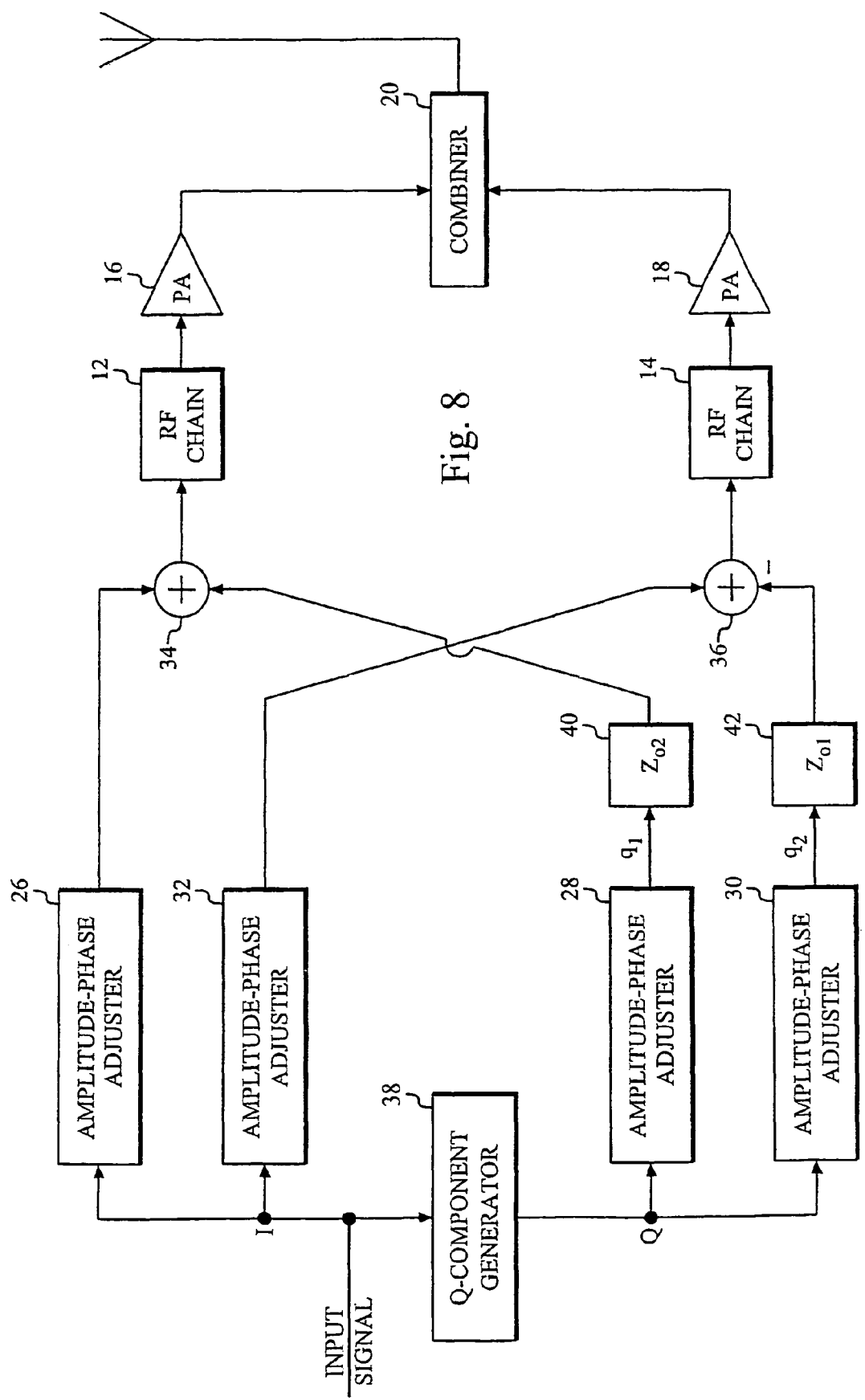
FIG. 8 is a block diagram of another embodiment of the composite amplifier in accordance with the present invention.

FIG. 8 is a block diagram of another embodiment of the composite amplifier in accordance with the present invention. This embodiment illustrates a second method (which does not assume an ideal balanced Chireix network) to adjust the amplitudes and phases of the linear parts to obtain maximum power output and maximum efficiency at the maximum input excitation level (with otherwise linear behavior). This can be done in a model of the amplifier, to obtain adjustment factors, or in the amplifier itself. The result of this operation is amplifier performance and efficiency similar to a class-B amplifier using the same transistors.

In this embodiment the amplitudes and phases of the nonlinear signal components are adjusted in order to minimize the average current consumption. This condition usually allows at least one of the transistors to have constant and maximum output voltage. Since this procedure should preferably be performed while ensuring linearity in the output, the amplified nonlinear signals should cancel each other at the output. As will be shown below, it is possible to achieve such a cancellation. However, in order to explain how this is done, it will be necessary to introduce a model of the output network of a Chireix amplifier.

Figure 9:
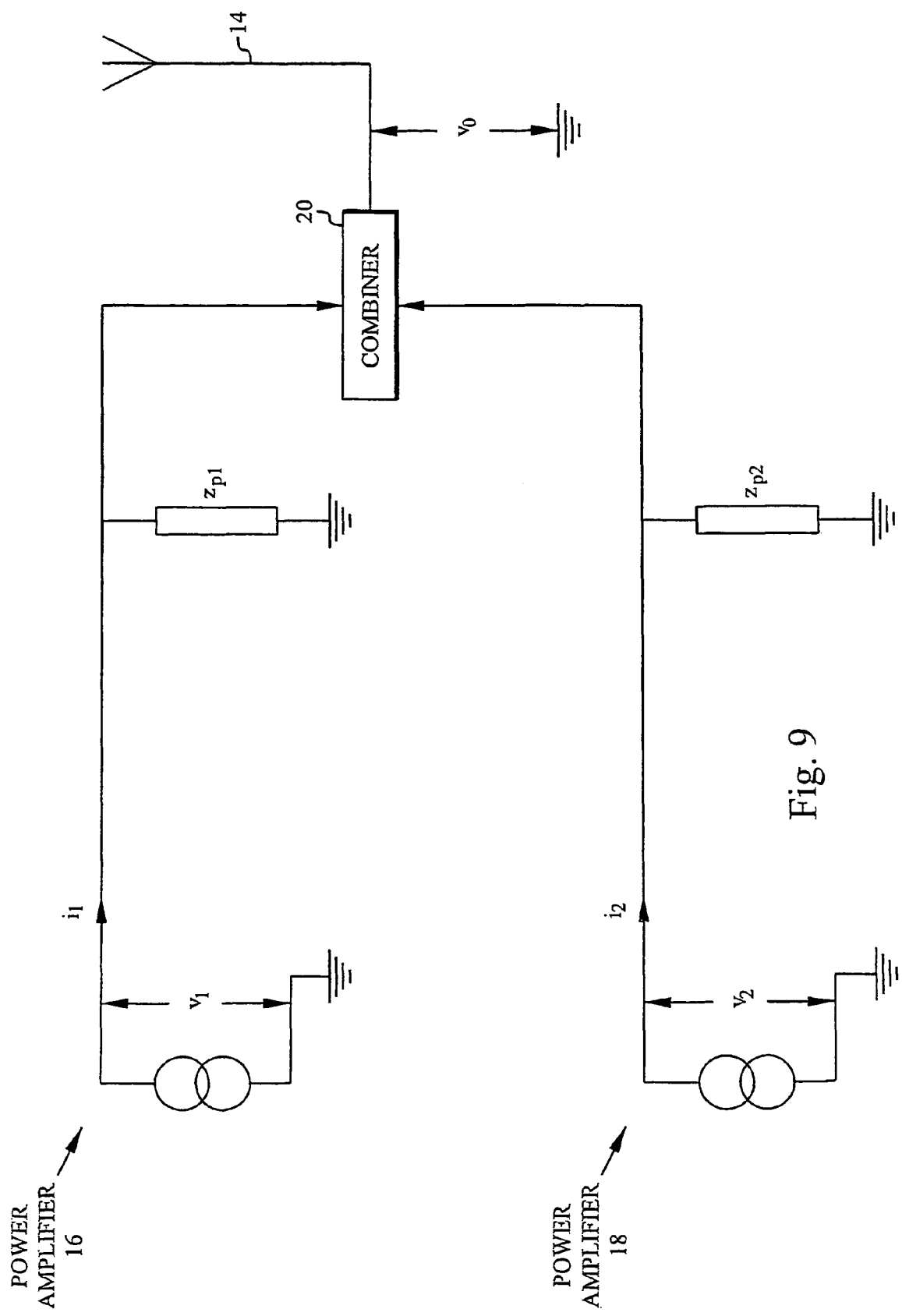
FIG. 9 is a model of the output network of a Chireix amplifier.

FIG. 9 illustrates such an output network model. In this model the active part of the amplifier transistor outputs are modeled as linear controlled current generators. The finite output conductances of the transistors are denoted $z_{p1}$ and $z_{p2}$, respectively. The impedances presented to each current generator output node are defined as:

$$z_{11} = \frac{v_1}{i_1}\bigg|_{i_2=0} \qquad z_{22} = \frac{v_2}{i_2}\bigg|_{i_1=0}$$

Similarly, the transimpedances, i.e. the voltage at the inactive amplifier output in response to an output current at the active amplifier, are defined as:

$$z_{21} = \frac{v_2}{i_1}\bigg|_{i_2=0} \qquad z_{12} = \frac{v_1}{i_2}\bigg|_{i_1=0}$$

Another quantity of interest is how RF currents from the output nodes of amplifier 16 and 18 transform into voltages at the output node of the composite amplifier. This quantity is represented by the output transimpedances $$z_{o2} = \frac{v_0}{i_2}\bigg|_{i_1=0} \qquad z_{o1} = \frac{v_0}{i_1}\bigg|_{i_2=0}$$

Assuming that all components are reasonably linear, superposition can be used for analyzing this model.

Returning to FIG. 8, since the output network (including combiner 20 and input lines to this combiner) may be unbalanced, it follows that $z_{o1}$ may be different from $z_{o2}$. Since the non-linear signal parts should cancel each other at the output, it is required that the linearity condition $$q_1 \cdot z_{o1} + q_2 \cdot z_{o2} = 0$$

is fulfilled, where $q_1$ and $q_2$ are the adjusted nonlinear components. The condition is possible since the nonlinear parts are identical, except for the sign. A simple way to fulfil this condition is to include a filter in each branch that emulates the output transimpedance of the other branch. Thus, in FIG. 9 a filter 40 emulating transimpedance $z_{o2}$ is included in the upper branch and a filter 42 emulating transimpedance $z_{o1}$ is included in the lower branch. Another possibility is to have a compensating filter in only one of the branches, for example $z_{o2} * z_{o1}^{-1}$ in the upper branch (here "*" denotes convolution in the time domain and multiplication in the frequency domain). In the embodiment of FIG. 8 it is possible to combine elements 28, 40 and 30, 42, respectively, to obtain frequency dependent amplitude and phase adjustment of the nonlinear drive signals.

By inserting wideband, frequency-dependent transimpedances $z_{o1}$ and $z_{o2}$ into the linearity condition, as described in the previous paragraph, instead of only their values at one specific frequency, linearity in the output is obtained over a wide bandwidth, Thus the non-linear part will cancel in the output for all frequencies within some specified bandwidth.

Figure 10:
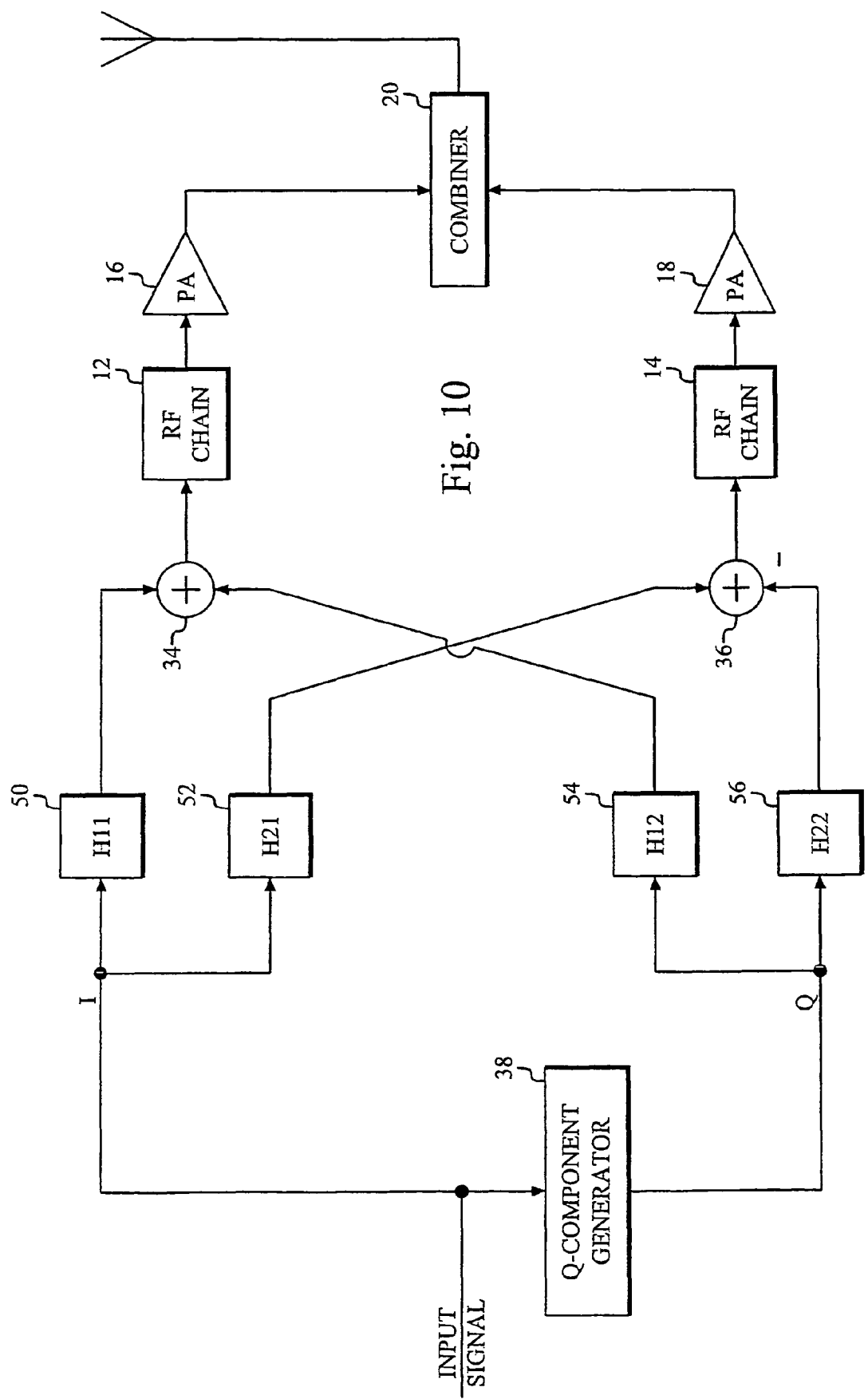
FIG. 10 is a block diagram of a further embodiment of the composite amplifier in accordance with the present invention.

Good efficiency generally requires that the supply voltage is maximally utilized. In certain types of output networks this can be obtained for both transistors, but generally it can be obtained at least for one transistor. This implies making frequency-dependent adjustments also to one or both of the linear parts (in addition to the described adjustment for linearity with filters that give a desired frequency dependence for the nonlinear parts). In general, one transistor output voltage can be made free from frequency dependencies altogether. For good efficiency, freedom from frequency dependence is not necessary. Usually, it is sufficient if the linear part and the nonlinear part of the transistor output voltage have substantially the same frequency dependence. An embodiment of the present invention incorporating these ideas is illustrated in FIG. 10.

Figure 11:
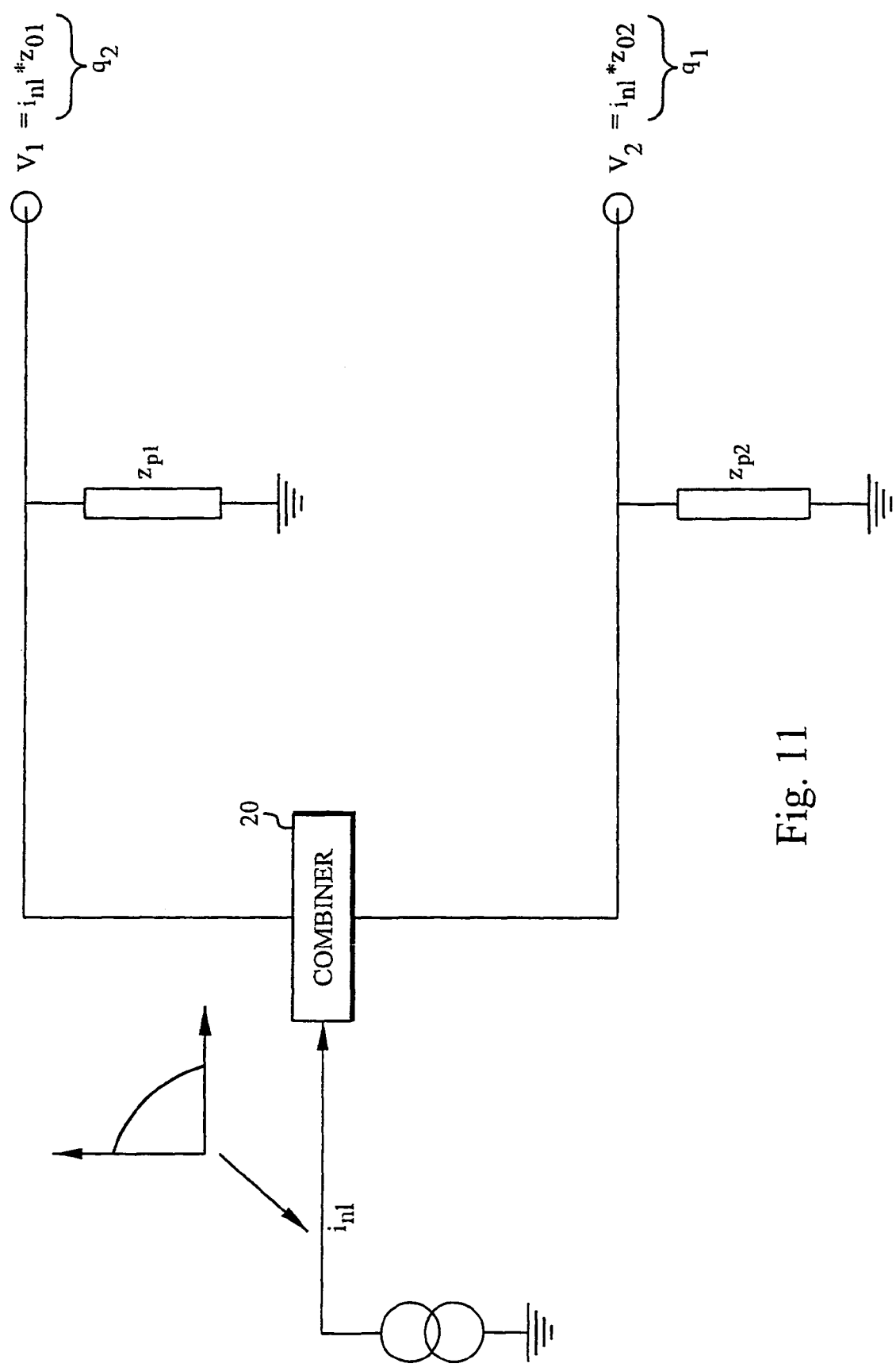
FIG. 11 is a diagram of a circuit for processing the nonlinear signal part in the composite amplifier of the present invention.

FIG. 11 is a diagram of a circuit for processing the nonlinear signal part in the composite amplifier of the present invention. This circuit is based on the Reciprocity Theorem, which states that: A current injected in the output node gives the same voltage response at the input nodes(s) as the same current injected at the input node would give at the output node. This means that a flipped, scaled copy of the output network illustrated in FIG. 9 can be used to obtain the desired signals $q_1$ and $q_2$.

An alternative to the network of the preceding paragraph is a network of two non-flipped, scaled copies of the output network in FIG. 9, or another network that gives the desired frequency response difference.

Assuming an amplifier adjusted for proper operation at the center frequency, the frequency-dependent modifications to the linear and nonlinear drive components can be expressed in several different ways. One example is:

$$\begin{cases} \text{Linear part to amplifier 16: } z_{12}^{-1} \text{ (normalized)} \\ \text{Linear part to amplifier 18: } z_{12}^{-1} \text{ (normalized)} \\ \text{Nonlinear part to amplifier 16: } z_{o1}^{-1} \text{ (normalized)} \\ \text{Nonlinear part to amplifier 18: } z_{o2}^{-1} \text{ (normalized)} \end{cases}$$

This embodiment is symmetrical with respect to the two amplifiers 16, 18. Another example is:

$$\begin{cases} \text{Linear part to amplifier 16: } z_{11}^{-1} \\ \text{Linear part to amplifier 18: } z_{12}^{-1} \\ \text{Nonlinear part to amplifier 16: } z_{o1}^{-1} \\ \text{Nonlinear part to amplifier 18: } z_{o2}^{-1} \end{cases}$$

This embodiment is better for amplifier 16. A further example is:

$$\begin{cases} \text{Linear part to amplifier 16: } z_{11}^{-1} \\ \text{Linear part to amplifier 18: } z_{12}^{-1} \\ \text{Nonlinear part to amplifier 16: } (z_{12} - z_{o2} * z_{11} * z_{o1}^{-1})^{-1} * z_{o2} * z_{o1}^{-1} \\ \text{Nonlinear part to amplifier 18: } (z_{12} - z_{o2} * z_{11} * z_{o1}^{-1})^{-1} \end{cases}$$

This embodiment eliminates the frequency dependence at the output node of one transistor (transistor of amplifier 16 in this case).

Figure 12:
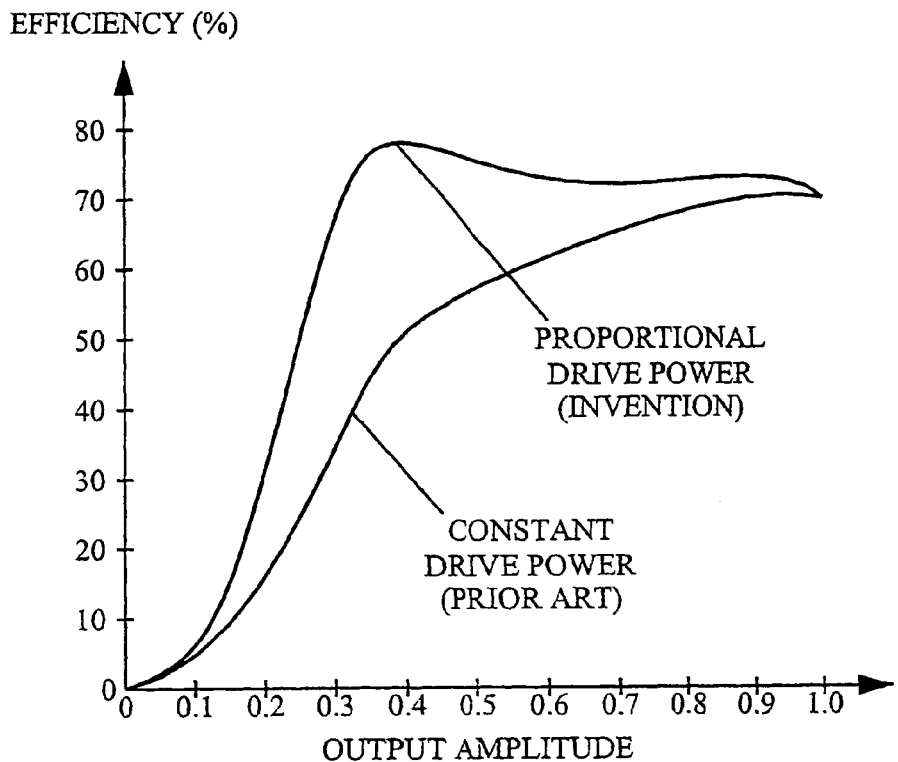
FIG. 12 is a diagram comparing efficiency of a conventional Chireix amplifier to the efficiency of a composite amplifier in accordance with the present invention.

The present invention results in a composite amplifier that is driven with non-constant amplitude signals, where especially the nonlinear parts are scaled down considerably compared to prior art solutions. The operating principle of the transistors of the amplifier has been changed, from constant-voltage generation through nonlinear saturated operation, as in the conventional Chireix amplifier, to generating controlled currents that make the output linear, possibly in a wide bandwidth, while maintaining the high DC to RF conversion efficiency of the original Chireix amplifiers. The amplitude of the drive signals follow the current consumption of the amplifier, instead of the transistor voltages as in prior art. The drive power is therefore reduced significantly, and the total efficiency is increased correspondingly. As illustrated by FIG. 12, the average efficiency is substantially higher than for prior art solutions, especially for high peak-to average power ratios. For a 9-dB peak-to-average power ratio, the average drive power in this example (with 10-dB gain) is one twentieth of that of a best-case prior art solution.

Furthermore, as has been demonstrated above, with the present invention the linearity of a Chireix or LINC type amplifier can be considerably increased. The increase in linearity can be obtained for wide bandwidths, by using wideband filtering systems separately on linear and nonlinear signal parts.

Since the nonlinear part of the drive signal (and hence the output current of the driven transistor) is scaled down considerably compared to previous solutions, the requirements for balance between paths and in the output combiner network are alleviated. Due to the substantially linear operating mode of the transistors, the possibility for adjustments to correct for amplitude imbalances is also greater than with prior art solutions. The precision required, in prior art solutions, for generating the nonlinear signal part in the signal component separator is also considerably lowered, since any nonlinear signal part in principle can be cancelled in the output using the proposed method. The precision necessary for obtaining high efficiency in the new system is considerably lower than the precision previously required for obtaining linearity.

The present invention thus increases both efficiency and linearity of an RF amplifier substantially. The solution reduces the precision requirements for the combining network, RF chains and signal component separation, thereby simplifying production of these amplifiers.

Figure 13:
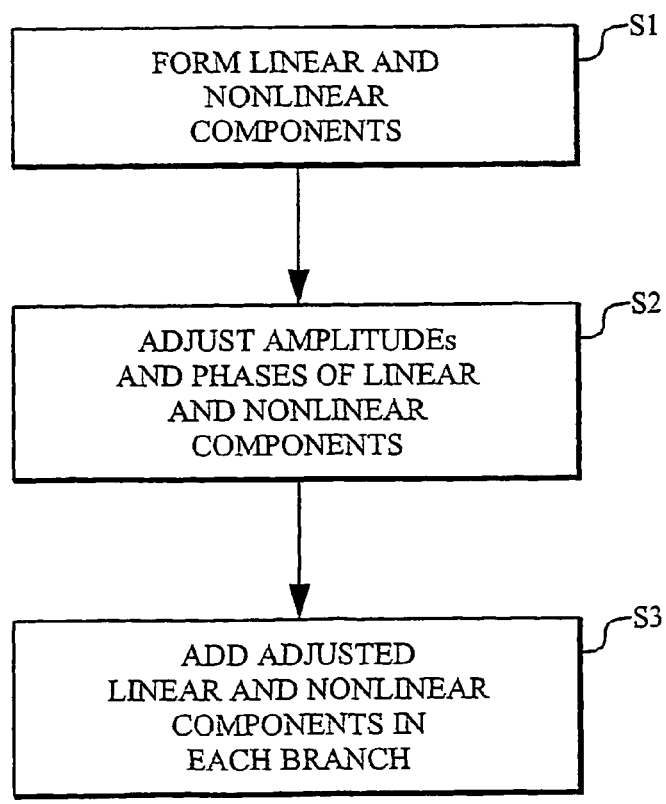
FIG. 13 is a flow chart illustrating the method in accordance with the present invention.

The method in accordance with the present invention is summarized in FIG. 13. In step S1 the linear and nonlinear components for each branch are formed. Step S2 adjusts the amplitudes and phases of these components and step S3 adds the adjusted linear component to the adjusted nonlinear component in each branch.

In the description above, the non-liner component was defined by the function $$\sqrt{1-A(t)^2}$$

In an embodiment where the amplifiers are kept out of saturation this function may be replaced by $$\sqrt{1-(k \cdot A(t))^2} - A(t) \cdot \sqrt{1-k^2}$$

where k is a constant that is slightly smaller than the (normalized) saturation input amplitude.

From the discussion above, it should be clear that the efficiency of the composite amplifier can in fact be increased by forming a non-constant drive signal that depends non-linearly on the amplitude of the input signal to at least one of power amplifiers 16, 18.

It will be understood by those skilled in the art that various modifications and changes may be made to the present invention without departure from the scope thereof, which is defined by the appended claims.

The invention claimed is:

1. A composite amplifier including a first and a second power amplifier connected to a Chireix type output network, said composite amplifier having a modulated input signal and substantially constant voltage amplitude at the output nodes of said power amplifiers, said composite amplifier being configured to generate, for at least one of said power amplifiers, a low power drive signal having non-constant amplitude that depends non-linearly on the amplitude of said input signal,
wherein the composite amplifier is configured to form each low power drive signal as a combination of a linear drive signal component, which depends linearly on the amplitude of said input signal, and a non-linear drive signal component, which depends non-linearly on the amplitude of said input signal.

2. The amplifier of claim 1, including means for individually adjusting at least one of amplitude and phase of at least one of said linear and non-linear drive signal components to lower drive power consumption.

3. The amplifier of claim 2, including means generating low power drive signals for both power amplifiers.

4. The amplifier of claim 3, including
means for adjusting amplitude and phase of said linear drive signal components by determining, based on a model emulating the behavior of said output network, amplitude and phase of the current in each power amplifier output node when the output node voltages of both power amplifiers are equal; and
means for adjusting amplitude and phase of said non-linear drive signal components by determining, based on said model emulating the behavior of said output network, amplitude and phase of the current in each power amplifier output node when the output node voltages of both power amplifiers are of equal magnitude but have opposite signs.

5. The amplifier of claim 3, including
means for adjusting amplitude and phase of said linear drive signal components for maximizing output power and efficiency at maximum input signal amplitude; and
means for adjusting amplitude and phase of said non-linear drive signal components for minimizing average power consumption.

6. The amplifier of claim 2, including means for frequency dependent amplitude and phase adjustment of said non-linear drive signal component.

7. The amplifier of claim 2, including means for frequency dependent amplitude and phase adjustment of both said linear and non-linear drive signal components.

8. The amplifier of claim 2, wherein said non-linear drive signal component depends as $\sqrt{1-A(t)^2}$ on the amplitude $A(t)$ of said input signal.

9. The amplifier of claim 2, wherein said non-linear drive signal component depends as $\sqrt{1-(k \cdot A(t))^2} - A(t) \cdot \sqrt{1-k^2}$ on the amplitude $A(t)$ of said input signal, where k is a constant slightly smaller than 1. 424

10. A transmitter including a composite amplifier having a first and a second power amplifier connected to a Chireix type output network, said composite amplifier having a modulated input signal and substantially constant voltage amplitude at the output nodes of said power amplifiers, said composite amplifier being configured to generate, for at least one of said power amplifiers, a low power drive signal having non-constant amplitude that depends non-linearly on the amplitude of said input signal,
wherein the composite amplifier is further configured to form each low power drive signal as a combination of a linear drive signal component, which depends linearly on the amplitude of said input signal, and a non-linear drive signal component, which depends non-linearly on the amplitude of said input signal.

11. The transmitter of claim 10, including means for individually adjusting at least one of amplitude and phase of at least one of said linear and non-linear drive signal components to lower drive power consumption.

12. The transmitter of claim 11, including means generating low power drive signals for both power amplifiers.

13. The transmitter of claim 12, including
means for adjusting amplitude and phase of said linear drive signal components by determining, based on a model emulating the behavior of said output network, amplitude and phase of the current in each power amplifier output node when the output node voltages of both power amplifiers are equal; and
means for adjusting amplitude and phase of said non-linear drive signal components by determining, based on said model emulating the behavior of said output network, amplitude and phase of the current in each power amplifier output node when the output node voltages of both power amplifiers are of equal magnitude but have opposite signs.

14. The transmitter of claim 12, including
means for adjusting amplitude and phase of said linear drive signal components for maximizing output power and efficiency at maximum input signal amplitude; and
means for adjusting amplitude and phase of said non-linear drive signal components for minimizing average power consumption.

15. The transmitter of claim 11, including means for frequency dependent amplitude and phase adjustment of said non-linear drive signal component.

16. The transmitter of claim 11, including means for frequency dependent amplitude and phase adjustment of both said linear and non-linear drive signal components.

17. The transmitter of claim 11, wherein said non-linear drive signal component depends as $\sqrt{1-A(t)^2}$ on the amplitude $A(t)$ of said input signal.

18. The transmitter of claim 11, wherein said non-linear drive signal component depends as $\sqrt{1-(k \cdot A(t))^2} - A(t) \cdot \sqrt{1-k^2}$ on the amplitude $A(t)$ of said input signal, where k is a constant slightly smaller than 1.

19. A method of driving a composite amplifier including a first and a second power amplifier connected to a Chireix type output network, said composite amplifier having a modulated input signal and substantially constant voltage amplitude at the output nodes of said power amplifiers, said method comprising:

generating, for at least one of said power amplifiers, a low power drive signal having non-constant amplitude that depends non-linearly on the amplitude of said input signal, and forming each low power drive signal as a combination of a linear drive signal component, which depends linearly on the amplitude of said input signal, and a nonlinear drive signal component, which depends non-linearly on the amplitude of said input signal.

20. The method of claim 19, including individually adjusting at least one of amplitude and phase of at least one of said linear and non-linear drive signal components to lower drive power consumption.

21. The method of claim 20, including generating low power drive signals for both power amplifiers.

22. The method of claim 21, including:

adjusting amplitude and phase of said linear drive signal components by determining, based on a model emulating the behavior of said output network, amplitude and phase of the current in each power amplifier output node when the output node voltages of both power amplifiers are equal; and adjusting amplitude and phase of said non-linear drive signal components by determining, based on said model emulating the behavior of said output network, amplitude and phase of the current in each power amplifier output node when the output node voltages of both power amplifiers are of equal magnitude but have opposite signs.

23. The method of claim 21, including:

adjusting amplitude and phase of said linear drive signal components for maximizing output power and efficiency at maximum input signal amplitude; and adjusting amplitude and phase of said non-linear drive signal components for minimizing average power consumption.

24. The method of claim 20, including frequency dependent amplitude and phase adjustment of said non-linear drive signal component.

25. The method of claim 20, including the step of frequency dependent amplitude and phase adjustment of both said linear and non-linear drive signal components.

26. The method of claim 20, wherein said non-linear drive signal component depends as $\sqrt{1-A(t)^2}$ on the amplitude $A(t)$ of said input signal.

27. The method of claim 20, wherein said non-linear drive signal component depends as $\sqrt{1-(k \cdot A(t))^2} - A(t) \cdot \sqrt{1-k^2}$ on the amplitude $A(t)$ of said input signal, where k is a constant slightly smaller than 1.

* * * * *